(12) United States Patent
Sevde et al.

(10) Patent No.: US 6,579,029 B1
(45) Date of Patent: Jun. 17, 2003

(54) MULTI-FUNCTION LATCH DEVICE FOR A MODULE UNIT

(75) Inventors: Gary P. Sevde, Atkins, IA (US); Charles L. Miksch, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 63 days.

(21) Appl. No.: 09/644,446

(22) Filed: Aug. 23, 2000

(51) Int. Cl.[7] .............................................. H01R 13/54
(52) U.S. Cl. ..................................... 403/322.3; 403/321
(58) Field of Search .............................. 403/321, 322.1, 403/322.3, 322.4

(56) References Cited

U.S. PATENT DOCUMENTS

| | | | |
|---|---|---|---|
| 4,083,616 A | * | 4/1978 | McNiece et al. ........ 339/45 M |
| 4,632,588 A | * | 12/1986 | Fitzpatrick .............. 403/321 X |
| 4,975,073 A | | 12/1990 | Weisman |
| 5,309,325 A | * | 5/1994 | Dreher et al. ........... 403/321 X |

* cited by examiner

Primary Examiner—Lynne H. Browne
Assistant Examiner—John R. Cottingham
(74) Attorney, Agent, or Firm—Nathan O. Jensen; Kyle Eppele

(57) ABSTRACT

A multi-function latch device which includes a latch base and a latch body rotationally connected to the latch base to rotate about a fulcrum between a latched position and unlatched position. The latch body rotates about the fulcrum to form first and second body portions of the latch body extending in opposed directions from the fulcrum. The first body portion includes a latch fixture rotatable with the latch body between the latched position and the unlatched position for selectively securing a module unit in the base unit and ejecting the module unit from the base unit. In the unlatched position, the second body portion forms a lever arm for inserting or removing the module unit relative to the base unit. The module unit is biased toward the base unit in the latched position to provide a desired electrical connection between connector plugs or plug sockets on the module and base units.

14 Claims, 6 Drawing Sheets

MULTI-FUNCTION LATCH DEVICE FOR A MODULE UNIT

FIELD OF THE INVENTION

The present invention relates to a multi-function latch device. In particular, the present invention relates to a multi-function latch device which has particular application for securing a module unit in a base unit.

BACKGROUND OF THE INVENTION

Electronic equipment or controls for aircraft or other machine are packaged in replaceable or portable line replaceable modules that can be exchanged for maintenance on an aircraft flight line. Different line replaceable modules are configured or equipped for performing various operating functions of an aircraft or other machine. Example line replaceable modules include a power unit or auto pilot controls. Depending upon operating requirements, various replaceable modules are inserted into the integrated process center cabinet for use. Line replaceable modules are secured in an integrated process center cabinet for use and are removed for replacement or exchange.

Modules can be difficult to insert or extract for replacement or exchange due to the mating forces between the process center cabinet and replaceable module.

Modules include connectors which mate with connectors in the integrated process center cabinet to electrically connect operating components of the line replaceable module to the integrated process center for use. During use, the process center cabinet and modules are subject to vibration and movement. Vibration or movement of the modules and cabinet can cause connectors to separate and severe movement or vibration can cause the modules to dislodge from the cabinet which can interrupt operation or control of an aircraft. The present invention addresses these and other problems and offers advantages not addressed by the prior art.

SUMMARY OF THE INVENTION

The present invention relates to a multi-function latch device. The multi-function latch device has application for securing a module unit to a base unit and includes a latch base and a latch body rotationally connected to the latch base to rotate about a fulcrum between a latched position and an unlatched position. The latch body rotates about the fulcrum to form first and second body portions of the latch body extending in opposed directions from the fulcrum. The first body portion includes a latch fixture operable between a latched position and an unlatched position for selectively securing the module unit in the base unit and ejecting the module unit from the base unit. In the unlatched position, the second body portion forms a lever arm for inserting or removing the module unit relative to the base unit. The latch device biases the module unit in an engaged position relative to the base unit to provide a desired electrical connection for operation.

DETAILED DESCRIPTION OF AN ILLUSTRATIVE EMBODIMENT

Figure 1:
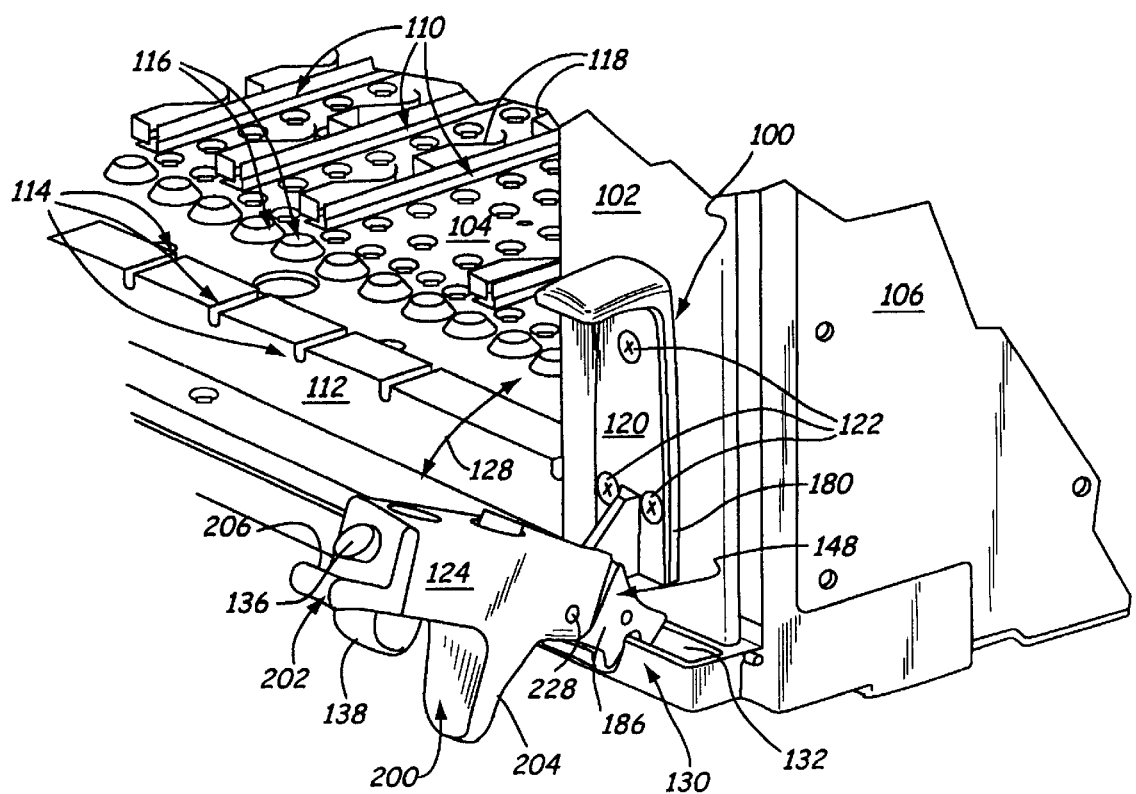
FIG. 1 is a perspective illustration of an embodiment of a latch device for a module unit insertable into a base unit shown in an unlatched position.

The present invention relates to a multi-function latch device 100 which has particular application for securing a module unit 102 into slots 104 of a base unit 106 as shown in FIG. 1. As shown, base unit 106 includes multiple slots 104 which are formed between rails 110. In the embodiment shown, base unit 106 includes a threshold rail 112 which has guide channels 114 for guiding module unit 102 into slots 104. Module units 102 are inserted into the base unit 106 for use and removed for maintenance, exchange or transport. In the embodiment shown, slots 104 include various components 116, 118 to bias module units 102 in slots 104 and limit vibrational movement as is known.

As previously described, the module units 102 are secured in the base unit 106 by latch device 100. FIG. 1 illustrates one embodiment of the multi-function latch device of the present invention. As shown, latch device 100 includes a latch base 120 connectable to module unit 102 by fasteners 122 and latch body 124 rotatable relative to latch base 120 as illustrated by arrow 128. Latch body 124 rotates as illustrated by arrow 128 between a latched position and an unlatched position (shown).

Latch body 124 rotationally supports a latch fixture 130 which rotates between a latched position and unlatched position (shown) via rotation of the latch body 124. In the latched position, latch fixture 130 cooperates with a base socket 132 on the base unit 106 to secure or lock module unit 102 in the base unit 106, and in the unlatched position, ejects module unit 102 from base unit 106. In the embodiment shown, latch body 124 and latch fixture 130 are held in the latched position to secure the module unit 102 in the base unit 106 by a latch pin 136 actuated by button 138 as will be described.

Figure 2:
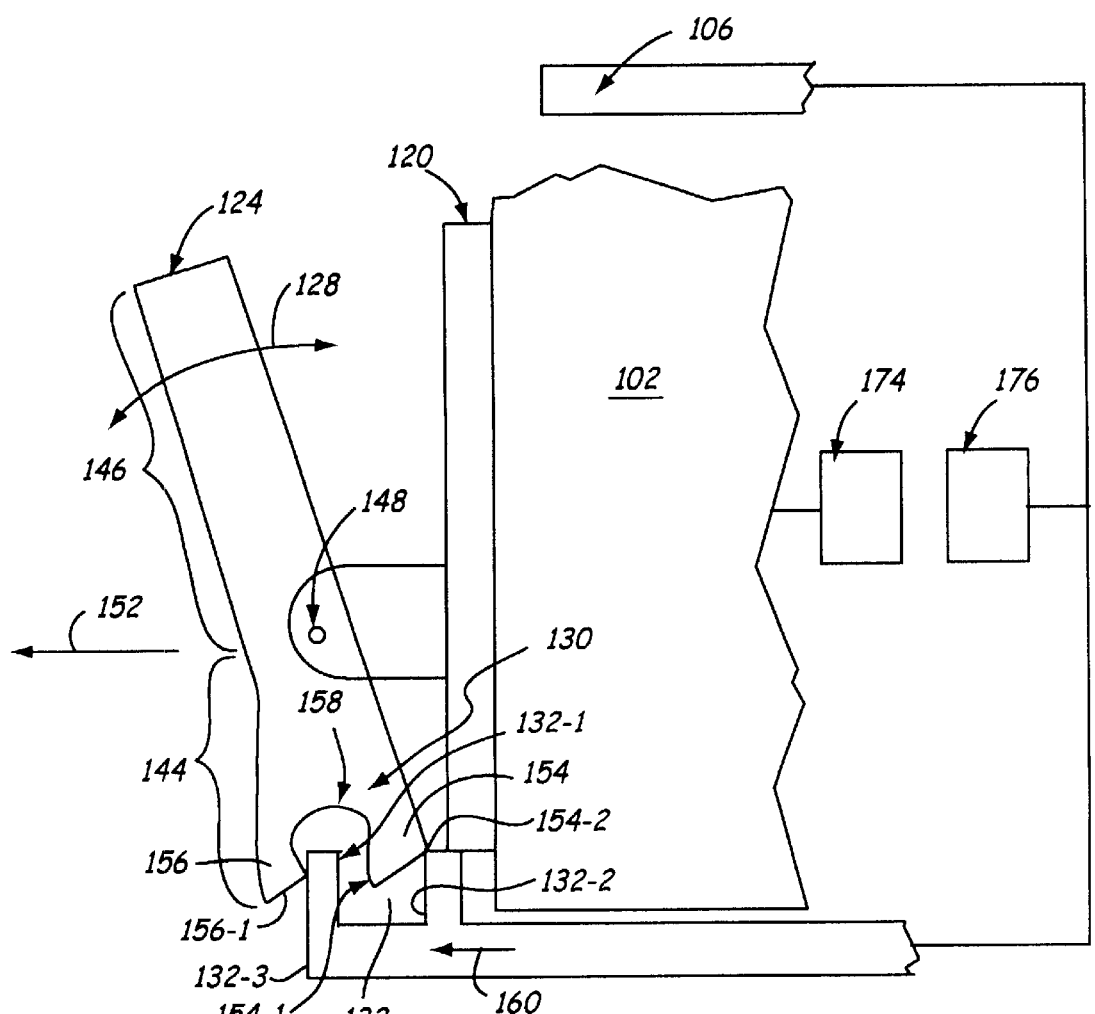
FIG. 2 is a schematic illustration of a multi-function latch device in an unlatched position.
Figure 3:
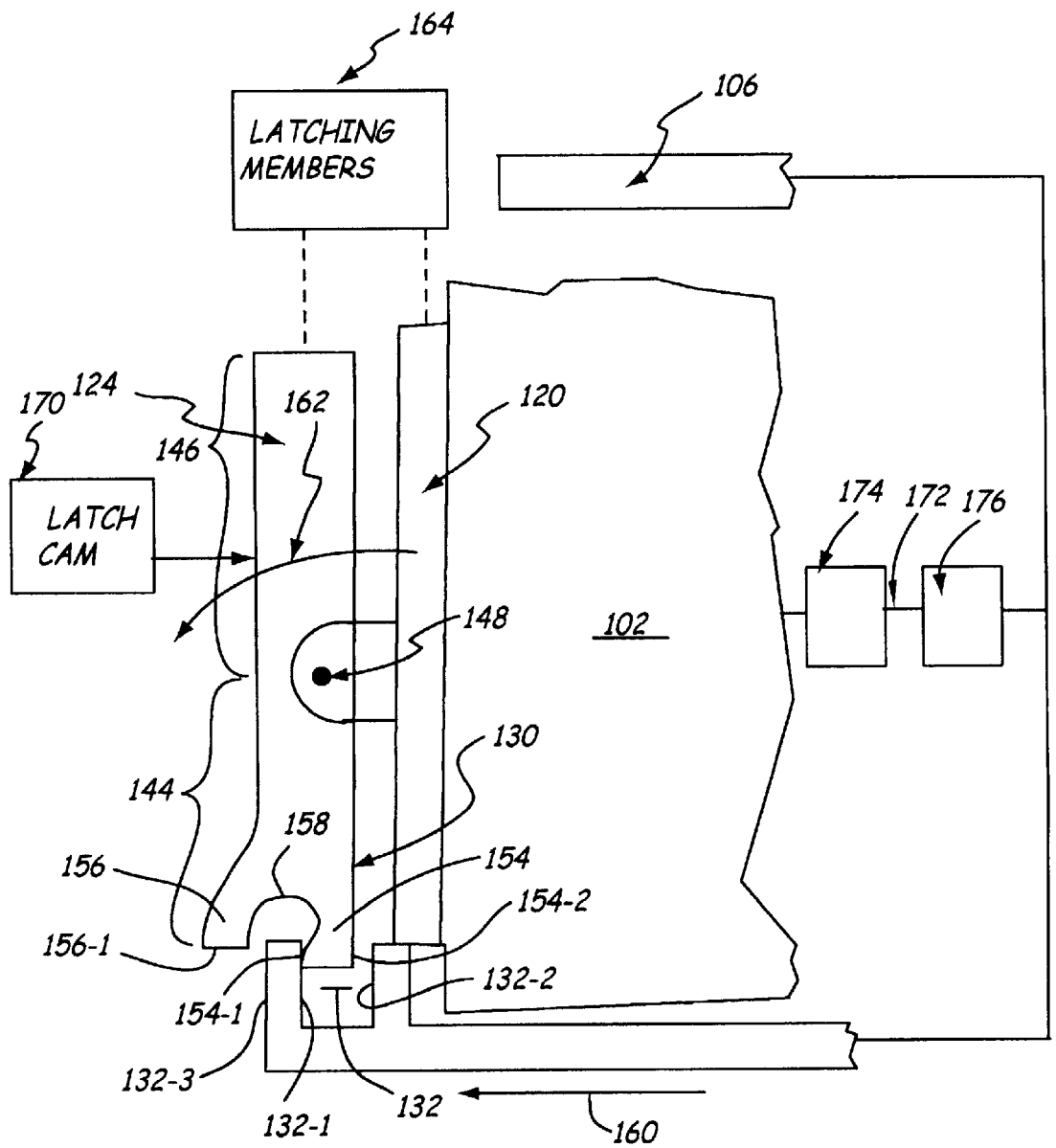
FIG. 3 is a schematic illustration of a multi-function latch device in a latched position.

FIGS. 2–3 schematically illustrate a multi-function latch device of the present invention. Latch body 124 is rotationally connected to latch base 120 to form first and second body portions 144, 146 rotatable about fulcrum 148 between the latched position and the unlatched position. The first and second body portions 144, 146 of latch body 124 extend in opposed directions from the fulcrum 148. The first body portion 144 rotationally supports the latch fixture 130 and the second body portion 146 forms an extendable lever arm in the unlatched position shown in FIG. 2 for insertion and removal of the module unit 102 from the base unit 106. Latch fixture 130 is configured to engage the base socket 132 in the latched position as shown in FIG. 3 to insert and secure the module unit 102 in the base unit 106, and in the unlatched position shown in FIG. 2, latch fixture 130 rotates to bias against base socket 132 to eject the module unit 102 from the base unit 106 for removal as illustrated by arrow 152.

In the embodiment shown, latch fixture 130 includes multiple fixture members 154, 156 separated by a latch channel 158. In the latched position, fixture member 154 provides a longitudinal latch surface 154-1 which is oriented to limit movement of the module unit 102 in a generally longitudinal direction as illustrated by arrow 160 to restrict withdrawal of the module unit 102 from the base unit 106. For insertion, rotation of latch fixture 130 (or latch body 124) to the latched position causes surface 154-1 to bias against socket surface 132-1 to insert module unit 102 into base unit 106. For extraction, latch fixture 130 (and latch body 124) is rotated counterclockwise as illustrated by arrow 162 in FIG. 3. Rotation of latch fixture 130 causes surface 154-2 of fixture member 154 to bias against (or contact) socket surface 132-2 and surface 156-1 of fixture member 156 to bias against (or contact) socket surface 132-3 to force or eject module unit 102 from base unit 106 for extraction Latch channel 158 provides clearance between fixture members 154 and 156 to allow fixture 130 to rotate between the latched position and the ejection or unlatched position. The latch body 124 is secured to latch base 120 by latching members 164 in the latched position to secure module unit 102 in base unit 106 which, in the embodiment illustrated in FIG. 1, includes latch pin 136 on latch body 124.

As illustrated in FIG. 3, in the latched position, a latch biasing mechanism 170 (illustrated schematically) supplies a bias force to the latch base 120 to bias the module unit 102 in the base unit 106 to provide a mating connection (as illustrated diagrammatically by line 172) between connector plugs or plug sockets 174, 176 on module unit 102 and base unit 106. Thus as described, the multi-function latch device of the present invention includes a latch fixture to secure a module unit 102 in a base unit 106 for use and eject the module unit 102 for extraction, a lever device which provides a mechanical advantage for inserting or removing the module unit 102 from the base unit 106, and a latch biasing mechanism for providing a mating connection between connector plugs and plug sockets 174, 176 of the module unit 102 and base unit 106.

Figure 4:
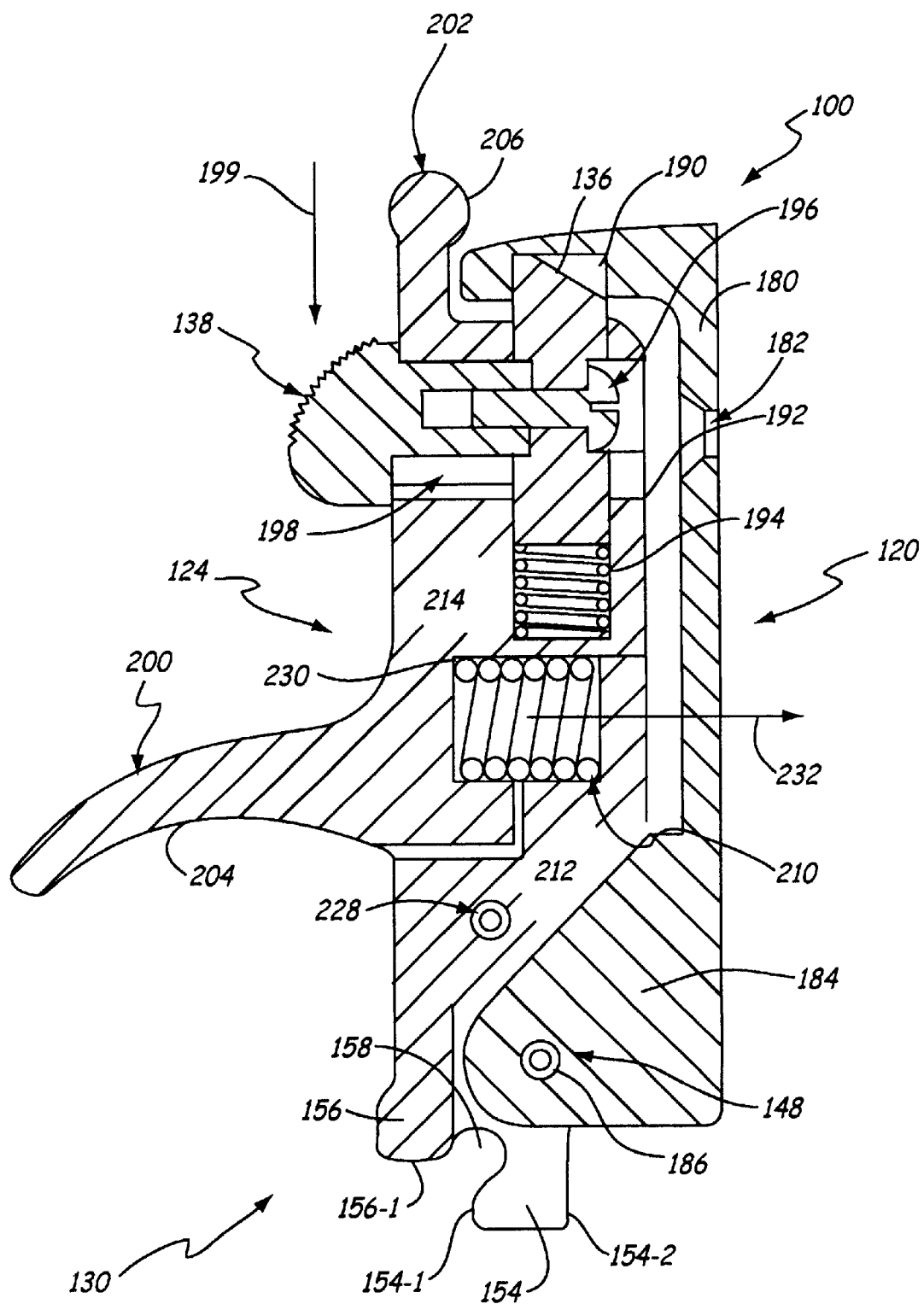
FIG. 4 is a cross-sectional view of the embodiment of the latch device illustrated in FIG. 1.

FIG. 4 is a cross-sectional view of the embodiment of the latch device illustrated in FIG. 1. As shown, latch base 120 includes latch bracket 180 including fastener openings 182 (only one shown) to connect latch base 120 to module unit 102, and a body plate. 184. Although a particular latch base 120 is shown, application is not limited to the particular embodiment shown. For example, latch base 120 could be integrally formed to the module unit 102 and does not need to be separately fastened. Latch body 124 is rotationally connected to plate 184 via pin 186 to form the first and second body portions of latch body 124 and fulcrum 148, as previously described in FIGS. 2–3.

Device 100 is locked in the latch position via engagement of pin 136 in detent 190 on latch base 120 which cooperatively form latching members 164 in the embodiment shown to secure latch body 124 in the latched position. Pin 136 is slidable in channel 192 of latch body 124 between a retracted position and an extended position. In the extended position, pin 136 is seated in detent 190 as shown and in the retracted position, pin 136 is withdrawn from detent 190. Pin 136 is normally biased by spring 194 in the extended position. Pin 136 is retracted to unlatch latch body 124 from latch base 120 via button 138 connected to pin 136 by fastener 196 and operable in channel 198 of latch body 124 as illustrated by arrow 199.

As previously explained, the second body portion of latch body 124 forms an extendable lever arm operable between a latched position and an extended unlatched position. As best shown in FIG. 1, in the unlatched position, latch body 124 rotates to form the extended lever arm which is angled from latch base 120 to provide mechanical leverage for inserting or removing module unit 102 from base unit 106.

In the embodiment shown in FIG. 4, lever arm includes an outwardly extending lever handle 200 and a thumb plate 202.

As best illustrated in FIG. 1, in the unlatched position, an operator's fingers wrap around handle 200 and grip a curved surface 204 while an operator's thumb rests on surface 206 of thumb plate 202. As previously explained, in the unlatched position, latch fixture 130 is rotated, as illustrated in FIG. 1, to allow the module unit 102 to be inserted or extracted from base unit 106. To insert or remove module unit 102, an operator grips handle 200 and thumb plate 202, as described and either pulls the module unit 102 from or pushes the module unit 102 into the base unit 106. Although a particular lever arm design is shown, application is not limited to the specific design shown including handle 200 and thumb plate 202.

Figure 5:
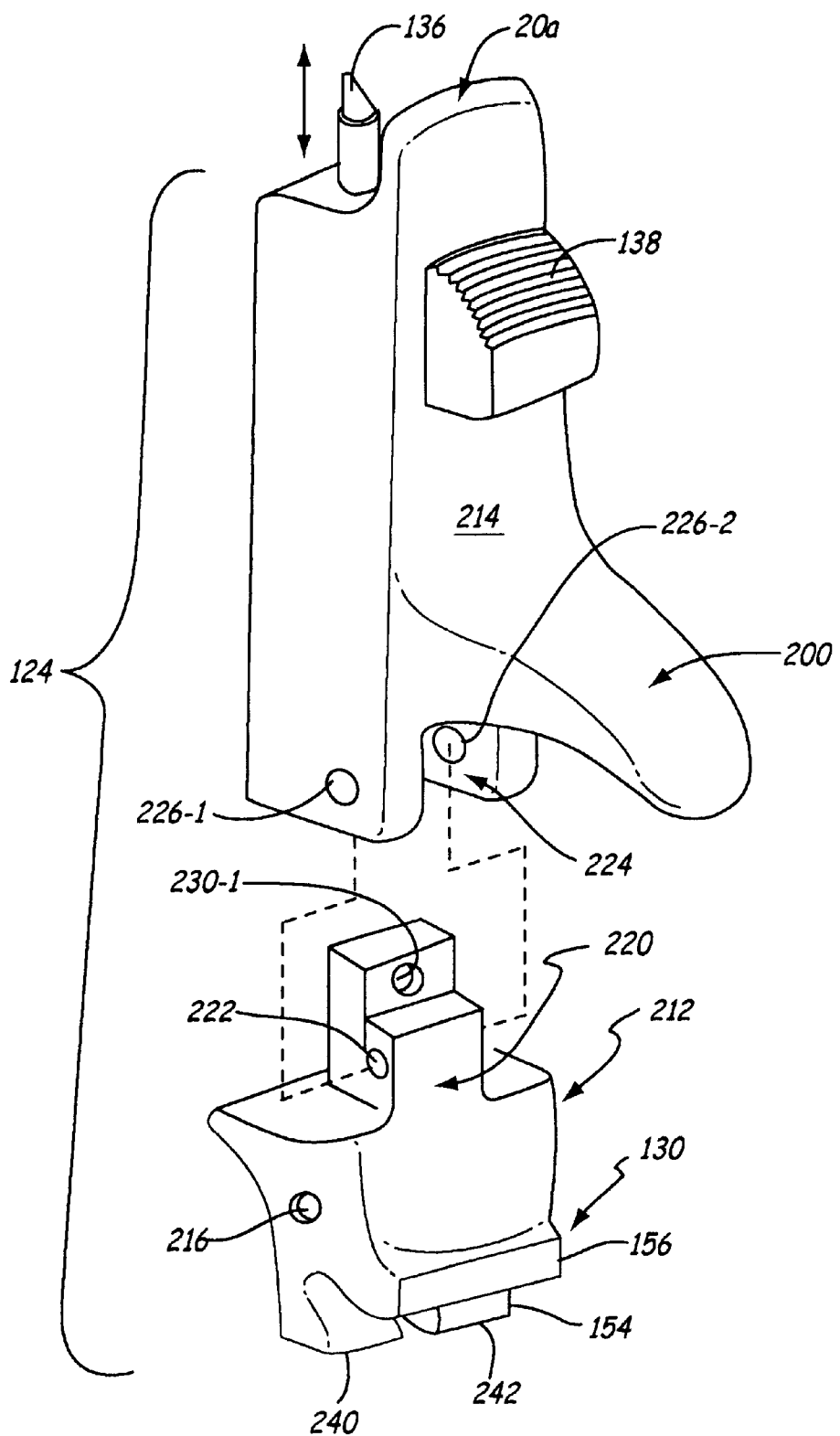
FIG. 5 is a perspective illustration of a composite structure for a latch body of the latch device illustrated in FIG. 4.

In the embodiment illustrated in FIG. 4, latch biasing mechanism 170 includes a helical compression spring 210 to supply a biasing force to the latch base 120. As cooperatively shown in FIGS. 4–5, latch body 124 is formed of a composite structure including first and second composite body members 212, 214. Composite body member 212 includes a pin channel 216, shown in FIG. 5, and supports latch fixture 130. Pin 186, shown in FIG. 4, extends through channel 216 to rotationally connect body member 212 of latch body 124 to latch base 120 to form fulcrum 148.

Body member 212 includes a stem 220 which includes pin channel 222. Stem 220 fits into slot 224 on body member 214 which includes pin channels 226-1, 226-2. Channel 222 on stem 220 is aligned with channels 226-1, 226-2 on body member 214 and a pin 228, shown in FIG. 4, is inserted through channels 222, 226-1, 226-2 to connect body members 212, 214 to form the composite latch body 124. A spring channel 240 is cooperatively formed by channel portions on body members 212, 214 which are located a distance spaced from the fulcrum 148 and latch fixture 130. Spring 210 seats in channel 230 as shown in FIG. 4 to supply a biasing force, as will be explained.

For operation, spring 210 supplies a force in the direction illustrated by arrow 232 to body member 212, which biases body member 212 in a clockwise direction relative to fulcrum at pin 186. As the device approaches the latched position, as shown in FIG. 3, latch surface 154-1 of fixture member 154 biases against a longitudinal socket surface 132-1 which limits rotation of body member 212 about the fulcrum at pin 186. Further clockwise rotation of body member 214 about pin 228 may be possible but will be resisted by spring 210 until the device reaches the latched position. Thus, force is transferred to latch base 120 to provide a biasing force to the module unit 102 in the latched position as previously described.

Although a particular latch biasing mechanism is described, application is not limited to the specific embodiment described. For example, biasing force can be supplied by a leaf spring or other biasing member and imparted to module unit 102 through fixture member 154 as shown, or in an alternate fashion. For example, latch body 124 can include a flexure joint or portion to bias fixture member 154 against socket surface 132-1 to provide a biasing force to module unit 102.

As described, in the latched position, fixture member 154 restricts movement of the module unit 102 out of the base unit 106 so that module unit 102 is secured for use. Fixture member 154 cooperates with or engages socket surfaces to insert module unit 102 into the base unit 106 and eject module unit 102 for extraction. As shown, fixture member 154 includes feet 240, 242 having rounded latch surfaces which engage longitudinal surface 132-1 of socket 132 as shown in FIG. 3 to insert module unit 102 and abut longitudinal surface 132-1 of socket 132 to restrict longitudinal movement of the module unit in the latched position.

The device also includes a biasing mechanism to supply a biasing force to assure a mating connection between connector plugs or plug sockets 174, 176 on module units 102 and base unit 106 in the latched position. In the embodiment shown, feet 240, 242 (fixture member 154) bias against longitudinal surface 132-1 of socket 132 to transfer force from the biasing mechanism (spring 210 in FIG. 4) to bias module unit 102 toward base unit 106 in the latched position. Rotation of latch body 124 to the unlatched position provides an ejection force via latch fixture 130 as described and, in the unlatched position, the latch body 124 forms a lever arm for easier insertion and removal of the module unit 102.

Figure 6:
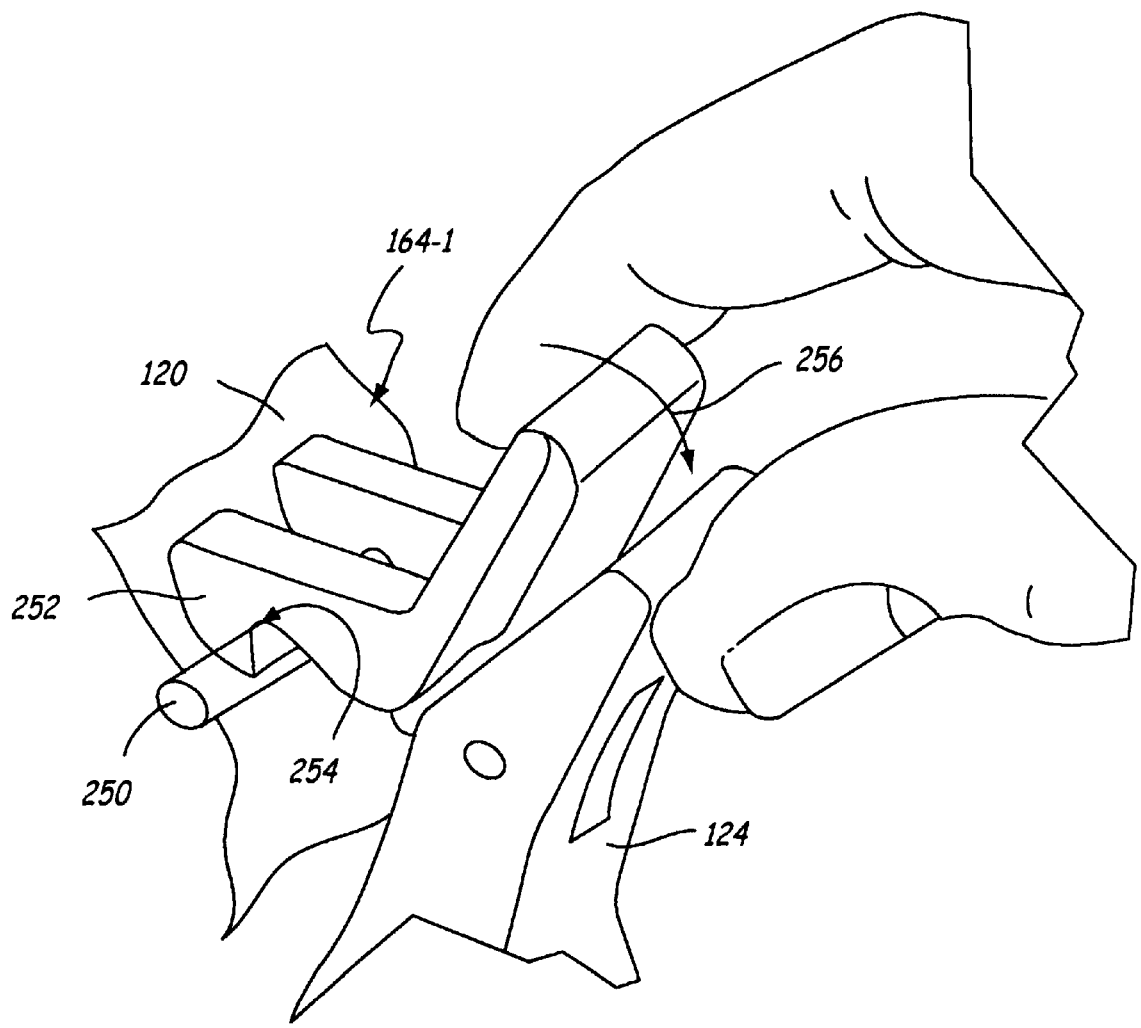
FIG. 6 is a perspective illustration of an alternate embodiment of latching members for securing the latched device in a latched position.

FIG. 6 illustrates an alternate embodiment for securing latch body 124 in a latched position relative to latch base 120. As shown, latching members 164-1 illustrated in FIG. 6 include a latch rod 250 on the latch base 120 and a latch 252 rotatably coupled to the latch body 124 and operable between a latched position and an unlatched position. Latch 252 includes a detent channel 254 which engages latch rod 250 to secure latch body 124 relative to latch base 120 in the latched position. Latch 252 rotates, as illustrated by arrow 256, to disengage latch 252 from latch rod 250 to release latch body 124 from the latched position. Accordingly, alternate latching members 164 as described can be used to secure latch body 124 in the latched position relative to base unit 106.

Although the present invention has been described with reference to preferred embodiments, workers skilled in the art will recognize that changes may be made in form and detail without departing from the spirit and scope of the invention. Although described with respect to particular application for a module unit and base unit, use of the multi-function device is not limited to the particular applications described.

What is claimed is:

1. A latch device for releasably securing a module unit to a base unit, the latch device comprising:

a latch base secured to the module unit;

a latch body rotationally connected to the latch base to rotate about a fulcrum between a latched position and an unlatched position and forming opposed first and second body portions of the latch body extending in opposed directions from the fulcrum, the first body portion including a latch fixture, and in the unlatched position, the second body portion extending from the latch base at an angle to form a lever arm for the latch device;

latching members on the latch base and the latch body, the latching members connecting the latch base and latch body in the latched position to secure the latch fixture in the latched position and the latching members releasing the latch body and latch base to unlatch the latch fixture and allow the latch body to rotate about the fulcrum so that the second body portion forms the lever arm; and a latch biasing mechanism operably coupled to the latch base to supply a biasing force to the latch base in the latched position.

2. The device of claim 1 wherein the module unit is an avionic line replaceable module insertable into a slot of an avionic integrated process center cabinet.

3. The device of claim 1 wherein the latching members include a slidable latch pin operable between an extended position and a retracted position and a detent and in the extended position the latch pin being seated in the detent and in the retracted position the pin being spaced from the detent to selectively connect and release the latch base and latch body in the latched and unlatched positions.

4. The device of claim 3, wherein the latch pin is normally spring biased in the extended position and is retracted from the extended position by an actuator button operably coupled to the latch pin.

5. The device of claim 3 wherein the latch pin is supported on the latch body and the detent is formed on the latch base in alignment with the latch pin in the extended position.

6. The device of claim 1 wherein the latch fixture includes multiple fixture members and a latch channel therebetween.

7. The device of claim 1 wherein the latch fixture includes a fixture member having a longitudinal latch surface in the latched position.

8. The latch device of claim 1 wherein the latch biasing mechanism includes a helical compression spring.

9. The latch device of claim 8 wherein the first and second body portions comprise first and second composite body members, respectively, the first and second composite body members being rotatably connected by a pin, wherein the compression spring is seated in a channel formed between the first and second composite body members at a location spaced from the latch fixture to rotate the latch fixture on one of said body members to supply a biasing force to the latch base in the latched position.

10. The latch device of claim 1 wherein the latch biasing mechanism includes a spring coupled to the latch fixture to bias the latch fixture towards a socket surface to supply a biasing force to the latch base.

11. The latch device of claim 1 wherein the lever arm includes a lever handle extending outwardly from the lever arm.

12. The latch device of claim 1 wherein the lever arm includes a thumb plate.

13. The latch device of claim 1 wherein the latch fixture includes a fixture member adapted to engage a socket surface on the base unit when the latch body is rotated to the unlatched position to eject the module unit, and to engage a socket surface when the latch body is rotated to the latched position to insert the module unit into the base unit.

14. The device of claim 3, further including an actuator button operatively coupled to the latch pin, the actuator button configured to at least partially retract the latch pin into the second body portion to release the latch base from the latch body.

* * * * *